United States Patent
Schmitt et al.

(10) Patent No.: US 6,756,853 B2
(45) Date of Patent: Jun. 29, 2004

(54) SUPPLY VARIATION TOLERANT VCO

(75) Inventors: Jonathan A. Schmitt, Eden Prairie, MN (US); Roger L. Roisen, Minnetrista, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/167,149

(22) Filed: Jun. 11, 2002

(65) Prior Publication Data

US 2003/0227333 A1 Dec. 11, 2003

(51) Int. Cl.[7] .............................................. H03B 27/00
(52) U.S. Cl. ........................................ 331/57; 331/34
(58) Field of Search ............................... 331/34, 36 C, 331/1 A, 57

(56) References Cited

U.S. PATENT DOCUMENTS

| | | | | |
|---|---|---|---|---|
| 5,512,861 A | * | 4/1996 | Sharma | 331/74 |
| 5,777,520 A | * | 7/1998 | Kawakami | 331/1 R |
| 5,847,617 A | * | 12/1998 | Reddy et al. | 331/57 |
| 5,939,950 A | * | 8/1999 | Kamei | 331/57 |
| 5,994,969 A | * | 11/1999 | Bujanos | 331/57 |
| 6,100,769 A | * | 8/2000 | An et al. | 331/57 |
| 6,150,892 A | * | 11/2000 | Lee et al. | 331/46 |
| 6,310,928 B1 | * | 10/2001 | Yunome | 375/376 |
| 6,380,776 B1 | | 4/2002 | Yocom | 327/163 |

* cited by examiner

Primary Examiner—Kenneth B. Wells
(74) Attorney, Agent, or Firm—Christopher P. Maiorana, P.C.

(57) ABSTRACT

An apparatus comprising a plurality of serially coupled delay cells configured to generate an output signal having a frequency varied in response to a control signal. Each of the delay cells may be configured to generate one or more intermediate signals in response to the control signal and present the intermediate signals to a next of the delay cells. One or more next to the last of the intermediate signals may be fed back to a first of the delay cells. One or more last of the intermediate signals may be presented as the output signal.

19 Claims, 4 Drawing Sheets

US 6,756,853 B2

SUPPLY VARIATION TOLERANT VCO

FIELD OF THE INVENTION

The present invention relates to a voltage controlled oscillators (VCOs) generally and, more particularly, to a method and/or architecture for a supply variation tolerant VCO.

BACKGROUND OF THE INVENTION

Conventional voltage controlled oscillator (VCO) approaches are prone to output frequency jitter issues due to supply voltage (VDD) noise (i.e., variation). As supply voltages and the corresponding headroom decrease, the conventional approach of implementing regulators to reject VDD noise and reduce output frequency jitter is not practical.

It would be desirable to have a VCO that has an output frequency that is independent of VDD variation.

SUMMARY OF THE INVENTION

The present invention concerns an apparatus comprising a plurality of serially coupled delay cells configured to generate an output signal having a frequency varied in response to a control signal. Each of the delay cells may be configured to generate one or more intermediate signals in response to the control signal and present the intermediate signals to a next of the delay cells. One or more next to the last of the intermediate signals may be fed back to a first of the delay cells. One or more last of the intermediate signals may be presented as the output signal.

The objects, features and advantages of the present invention include providing a method and/or architecture for implementing a supply variation tolerant voltage controlled oscillator (VCO) that may (i) minimize and/or eliminate output frequency jitter due to supply voltage variations, (ii) provide a constant amount of current to change the output level at each delay change, (iii) have a delay change control current that is substantially independent of supply voltage, and/or (iv) have a reduced amount of output frequency jitter when compared to conventional VCO approaches.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
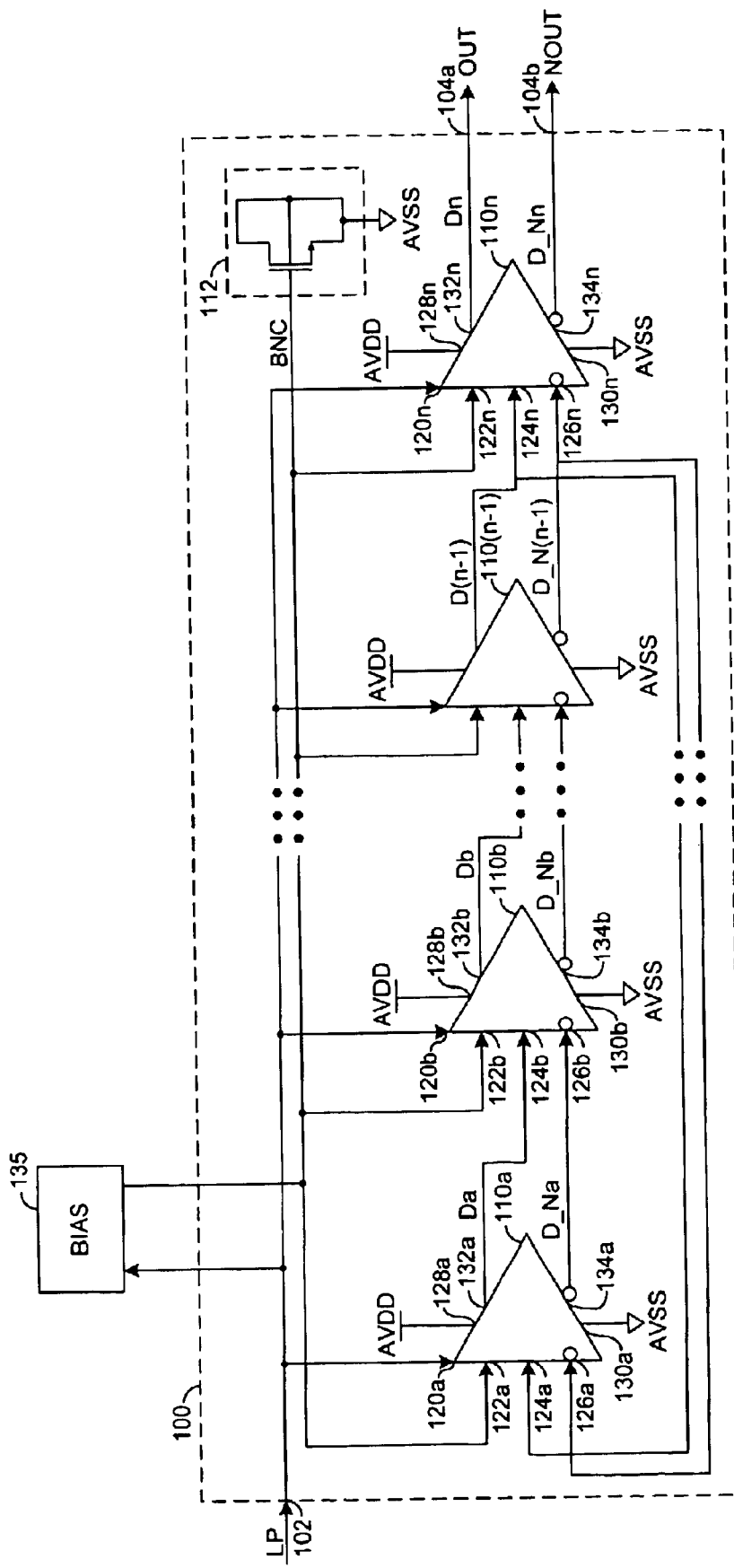
FIG. 1 is a diagram of a preferred embodiment of the present invention.

Referring to FIG. 1, a diagram of a circuit 100 is shown in accordance with a preferred embodiment of the present invention. The circuit 100 may be implemented as a supply variation tolerant voltage controlled oscillator (VCO). In one example, the circuit 100 may be implemented in connection with a phase locked loop (PLL) circuit (not shown). However, the circuit 100 may be implemented in connection with any appropriate circuit to meet the design criteria of a particular application. The circuit 100 may have an input 102 that may receive a signal (e.g., LP) and a pair of outputs 104a and 104b that may present signals (e.g., OUT and NOUT), respectively.

The signal LP may be implemented as a control signal. The signal LP may be implemented as the voltage at a filter capacitor in a PLL circuit. However, the signal LP may be implemented as any appropriate control signal to meet the design criteria of a particular application. The signal OUT may be implemented as an output signal having a frequency (e.g., a clock signal). The signal NOUT is generally the complement (e.g., inverse) of the signal OUT. The circuit 100 may be configured to generate the signal OUT (and/or NOUT) at a frequency set (e.g., fixed, varied, adjusted, determined, controlled, etc.) in response to the signal LP (e.g., the frequency of the signals OUT and/or NOUT may vary in proportion to the level (e.g., value, amount, etc.) of the signal LP).

The circuit 100 generally comprises a plurality of circuits 110 (e.g., 110a–110n) and a circuit (or device) 112. The circuits 110a–110n may be implemented as pseudo-differential delay cells (or circuits) having substantially the same delay time (e.g., both signals that are propagated through the circuits 110 may be delayed by substantially the same amount of time and each of the delay cells 110 may provide substantially the same delay). The delay time of the circuits 110a–110n may be controlled (e.g., set, adjusted, etc.) in response to the signal LP. The circuits 110a–110n are generally configured as serially coupled (e.g., cascaded, connected, etc.) delay stages (or cells) in a delay chain (or line). The circuit (or device) 112 may be implemented as a capacitance. In one example, the device 112 may be implemented as one or more transistors configured as a capacitor. In another example, the device 112 may be implemented as one or more capacitors.

The circuits 110a–110n may be implemented similarly. A first stage (e.g., start, beginning, etc.) of the circuit 100 delay chain (e.g., the circuit 110a) may have an input 120a that may receive the signal LP, an input 122a that may receive a signal (e.g., BNC), an input 124a that may receive a signal (e.g., D(n−1)), an inverting input 126a that may receive a signal (e.g., D_N(n−1)), an input 128a that may receive a supply voltage (e.g., AVDD), an input 130a that may receive a ground potential (e.g., AVSS), an output 132a that may present an intermediate signal (e.g., Da), and an inverting output 134a that may present an intermediate signal (e.g., D_Na).

An intermediate stage of the circuit 100 delay chain (e.g., the circuit 110i) may have an input 120i that may receive the signal LP, an input 122i that may receive the signal BNC, an input 124i that may receive a signal (e.g., D(i−1)), an inverting input 126i that may receive a signal (e.g., D_N(i−1)), an input 128i that may receive the supply voltage AVDD, an input 130i that may receive the ground potential AVSS, an output 132i that may present an intermediate signal (e.g., Di), and an inverting output 134i that may present an intermediate signal (e.g., D_Ni). The intermediate output signals D(i−1) and D_N(i−1) of a preceding delay cell 110(i−1) are generally presented to a succeeding delay cell 110i. The output signals (e.g., the intermediate signals D(n−1) and D_N(n−1)) of a next to the last stage (e.g., the stage 110(n−1)) of the circuit 100 are generally fed back to the inputs 124a and 126a, respectively, of the first stage circuit 110a.

The last (e.g., final, end, etc.) stage of the delay chain of the circuit 100 (e.g., the delay cell 110n) may have an input 120n that may receive the signal LP, an input 122n that may receive the signal BNC, an input 124n that may receive the signal D(n−1), an inverting input 126n that may receive the signal D_N(i−1), an input 128n that may receive the supply voltage AVDD, an input 130n that may receive the ground potential AVSS, an output 132n that may present a signal (e.g., Dn), and an inverting output 134n that may present a signal (e.g., D_Nn). The signal Dn is generally presented as the signal OUT and the signal D_Nn is generally presented as the signal NOUT.

The signal BNC may be implemented as a bias signal. The signal BNC may be derived from (or may be related to) the signal LP by a conventional circuit 135. The frequency of the signals OUT and/or NOUT may be further controlled (e.g., adjusted, set, etc.) in response to the signal BNC. The signals Da-Dn and D_Na-D_Nn may be implemented as intermediate signals. The signal D_N is generally the complement of the signal D. Each of the circuits 110a–110n may be configured to provide successive and substantially equal delay to the intermediate signals D and/or D_N as the signals D and/or D_N are propagated through the circuits 110a–110n in response to the control signal LP and/or the bias signal BNC.

The device (or circuit) 112 may have a first terminal that may receive the signal BNC and a second terminal that may be receive the ground potential AVSS. The circuit 112 may be configured as a de-coupling capacitance that may provide the bias signal BNC to the circuits 110a–110n. The circuit 112 may de-couple the delay line circuits 110a–110n from circuits and/or components (not shown) that are configured to receive the signals OUT and/or NOUT.

The circuit 100 may be configured to contain (e.g., carry, propagate) a plurality of cycles (or oscillations) of the signal OUT (and/or NOUT). In one example, the circuit 100 may be implemented having four of the delay circuits 110 (e.g., a delay chain that generally comprises circuits 110a–110d). The implementation of the circuit 100 having three of the delay circuits 110 plus an output circuit 110 may be configured to contain (e.g., carry, propagate, etc.) two cycles (or oscillations) of the signal OUT (and/or NOUT) within the first three delay circuits (e.g., the circuits 110a–110c) during a normal mode of operation. However, the circuit 100 may be configured to provide any appropriate number of delay cells 110 to contain (e.g., carry, propagate, etc.) an appropriate number of cycles of the output signal OUT to meet the design criteria of a particular application.

Figure 2:
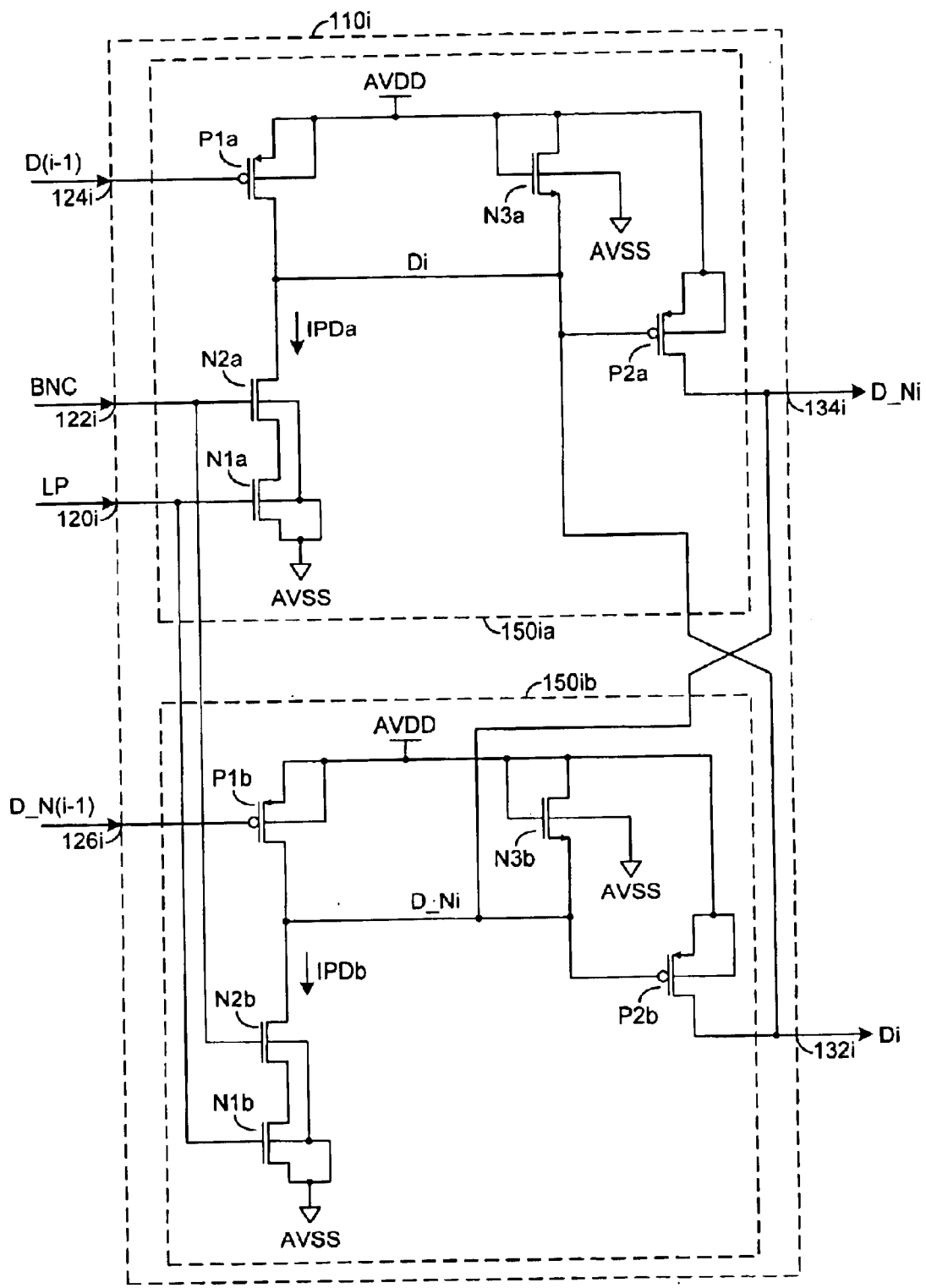
FIG. 2 is a diagram of a delay cell of the present invention.

Referring to FIG. 2, detailed diagram illustrating the circuit 110 in accordance with a preferred embodiment of the present invention is shown. The circuit 110i generally comprises a pair of matched circuits 150i (e.g., similarly implemented circuits 150ia and 150ib). The circuits 150ia and 150ib may be configured as sides of a pseudo-differential delay cell (e.g., circuit, block, etc.) having substantially equal delay through each side (e.g., signals may be propagated through the circuits 150ia and 150ib having substantially the same delay).

The circuit 150a generally comprises transistors N1a, N2a, N3a, P1a, and P2a. The transistors N1a, N2a, and N3a may be implemented as NMOS transistors. The transistors P1a and P2a may be implemented as PMOS transistors. The transistor N1a may have a gate that may receive the signal LP, a first source/drain and a bulk (or well) that may receive the ground potential AVSS, and a second source/drain that may be connected to a first source/drain of the transistor N2a. The transistor N2a may have a gate that may receive the signal BNC, a bulk (or well) that may receive the ground potential AVSS, and a second source/drain that may be connected to a first source/drain of the transistor P1a. The transistor N3a may have a first source/drain may be connected to the first source/drain of the transistor P1a, a bulk (or well) that may receive the ground potential AVSS, and a second source/drain and a gate that may receive the supply voltage AVDD. The transistor N3a may be diode-connected. The transistor N3a may be configured to limit the voltage swing of the output signal D_Ni. The transistor N3a may be configured to provide a constant drain/source voltage (e.g., Vds) across the input transistor P1a that is independent of the supply voltage AVDD.

The transistor P1a may have a gate that may receive the signal D(i−1), and a bulk (or well) and a second source/drain that may receive the supply voltage AVDD. The transistor P2a may have a gate that may be connected to the first source/drain of the transistor P1a, a bulk (or well) and a first source/drain that may receive the supply voltage AVDD, and a second source/drain that may present the signal D_Ni. The transistor P1a may be configured to pull the output signal D_Ni back to the supply voltage AVDD when the input signal LP has a low value (e.g., the signal LP has a voltage less than the threshold voltage Vth of the transistor N1a). The transistor P2a may be cross-coupled with the transistor P1a. The transistor P2a may be configured as an output transistor that may buffer the output signal D_Ni. The transistor P2a may be configured to synchronize the speed of the circuit 100 to each successive cycle of the signal OUT.

A pull down current (e.g., IPDa) may flow between the first source/drain of the transistor P1a and the second source/drain of the transistor N2a. The current IPD may be a delay current. The circuit 150 may be configured to generate the current IPD in response to the signal LP and/or the signal BNC. The delay generated by the circuit 150 (and the frequency of the signal OUT generated by the circuit 100) may be proportional to (or generated in response to) the current IPD (e.g., the signal LP). The current IPD that corresponds to the output level of the delay change generated at each of the circuits 150 is generally constant and independent of the supply voltage AVDD.

The circuit 150b may be implemented similarly to the circuit 150a. The gate of transistor P1b may receive the signal D_N(i−1) and the second source/drain of the transistor P2b may present the signal Di. The circuits 150a and 150b may provide substantially equal delay to the signals D and D_N. The circuit 110i is generally configured to generate the next intermediate signals Di and D_Ni in response to the prior intermediate signals D(i−1) and D_N(i−1), the signal LP, and/or the signal BNC.

Since drain/source voltage Vds across the input transistor P1 is generally constant, the amount of the current signal IPD (and the voltage level of the signal LP) is generally (i) constant and consistent across all of the circuits 150aa–150bn (e.g., all of the circuits 110a–110n) and (ii) independent of the supply voltage AVDD. The output of the circuit 100 (e.g., the frequency of the signals OUT and/or NOUT) may (i) have minimal dependence on the supply voltage AVDD and (ii) exhibit reduced jitter when compared to conventional VCO approaches. The circuit 100 may minimize and/or eliminate frequency jitter on the signal OUT (and/or NOUT) due to supply voltage AVDD variations. While the present invention may be implemented having any appropriate level supply voltage AVDD, the present invention may be especially advantageously implemented when the supply voltage is less than 1.2V.

Figure 3:
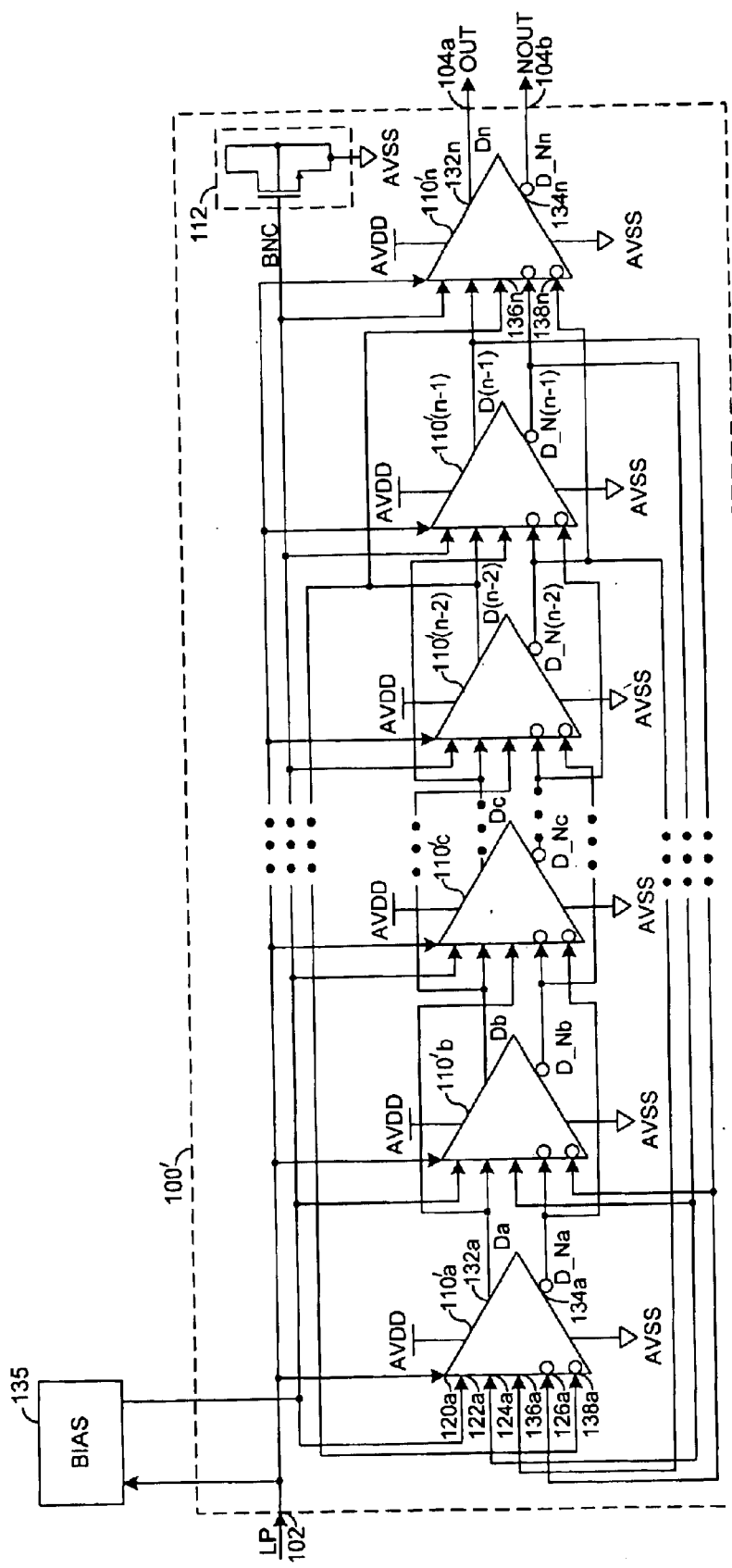
FIG. 3 is a diagram of an alternate embodiment of the present invention.

Referring to FIG. 3, a diagram of a circuit 100' illustrating an alternative embodiment of the present invention is shown. The circuit 100' may be implemented similarly to the circuit 100. The circuit 100' generally comprises a plurality of circuits 110' (e.g., circuits 110'a–110'n). The circuit 100' may be configured to provide delay interpolation to the signals (e.g., the signals D and/or D_N) that are propagated through the delay chain (e.g., the delay cells 110'a–110'n). Each of the circuits 110' are generally coupled (e.g., connected, cascaded, etc.) to a number of preceding (and/or succeeding) circuits 110'. The signals D and/or D_N generally depend on (e.g., are interpolated in response to) a number of preceding (and/or succeeding) circuits 110'.

The circuit 100' may be configured to contain (e.g., carry, propagate, etc.) a plurality of cycles of the signal OUT (and/or NOUT). In one example, each cycle of the signal OUT (and/or NOUT) may propagate through every other (e.g., alternate ones) of the circuits 110'a–110'n as well as the next one of the circuits 110'a–110'n. The circuit 100' may be configured to provide delay interpolation to the signals OUT and/or NOUT. The circuit 100' may carry (e.g., contain, propagate, etc.) a plurality of oscillations (or cycles) of the signals OUT and/or NOUT synchronized to a same (e.g., substantially equal) frequency. The circuit 100' may be configured to (i) operate at twice the speed, (ii) have a reduced amount of jitter, and/or (iii) have improved independence from supply voltage AVDD variation when compared to conventional VCO approaches. In one example (e.g., an example where each circuit 110' is generally dependent on (or interpolates across) the preceding x circuits 110' and x equals 2)), the circuit 100' may be configured to carry (e.g., contain, propagate, etc.) and/or synchronize 2*x (4) cycles of the signals OUT and/or NOUT.

The first (e.g., start, beginning, etc.) stage of the circuit 100' (e.g., the circuit 110'a) may have an input 124a that may receive the signal D_N(n−1), an inverting input 126a that may receive the signal D(n−1), an input 136a that may receive the signal D_N(n−2), and an inverting input 138a that may receive the signal D(n−2). The intermediate signals D and D_N of (i) the next to the last delay cell (e.g., the delay cell 110'(n−1) and of (ii) the second to the last delay cell (e.g., the delay cell 110'(n−2) may be fed back to the first delay cell 110'a.

The second stage of the circuit 100' (e.g., the circuit 110'a) may have an input 136b that may receive the signal D_N (n−1), and an inverting input 138b that may receive the signal D(n−1). The intermediate signals D and D_N of the next to the last delay cell (e.g., the delay cell 110'(n−1) may be fed back to the second delay cell 110'b.

Intermediate stages of the circuit 100' (e.g., the circuits 110'c–110'(n−1)) and a last stage of the circuit 100' (e.g., the circuit 110'n) may have an input 136i that may receive the signal D(i−2), and an inverting input 138i that may receive the signal D_N(i−2). In general, the intermediate signals Di and/or D_Ni that are presented by a delay cell 110'i may be fed forward to (i) a next succeeding delay cell 110'(i+1) and (ii) a second next succeeding delay cell 110'(n+2). Similarly, the delay cell 110'i generally receives the signals D(i−1), D_N(i−1), D(i−2), and/or D_N(i−2) from the next preceding and second next preceding delay cells 110'(i−1) and 110'(i−2), respectively. The carry (e.g., propagation, interpolation, etc.) increment x may be implemented as any appropriate integer to meet the design criteria of a particular application. For example, when x=3 (not shown), the delay cell 110'i may be configured to receive the signals D(i−1), D_N(i−1), D(i−3), and/or D_N(i−3) from the next preceding and third next preceding delay cells 110'(i−1) and 110'(i−3), respectively.

Figure 4:
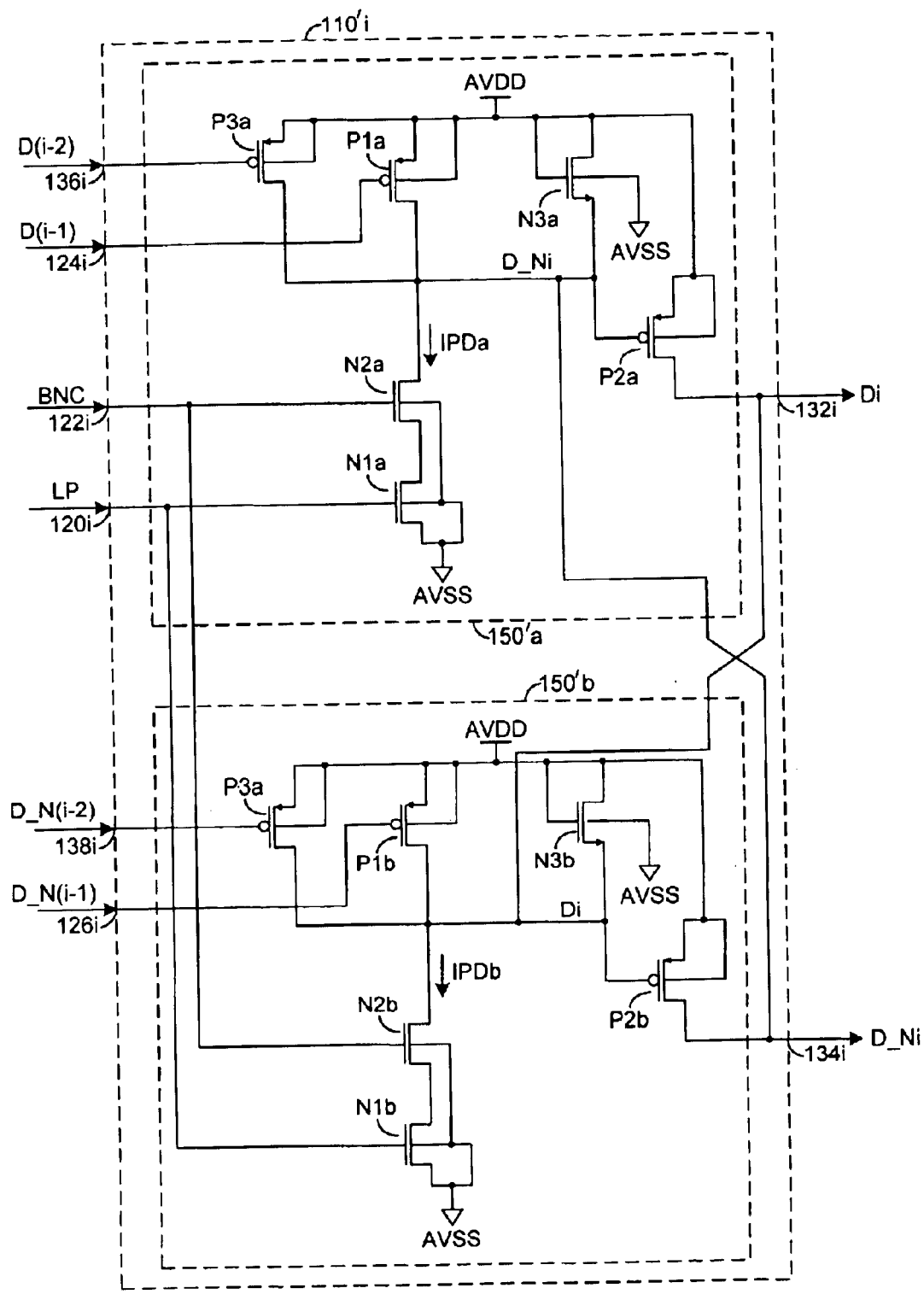
FIG. 4 is a diagram of a delay cell of the alternate embodiment of the present invention.

Referring to FIG. 4, a detailed diagram illustrating the circuit 110'i of the present invention is shown. The circuit 150'i generally comprises a transistor P3. The transistor P3 may be implemented as a PMOS transistor similarly to the transistor P1. The transistor P3 may be implemented as an input transistor. The transistor P3a may have a first source/drain and a bulk (well) that may receive the supply voltage AVDD, a gate the may receive the intermediate signal D(i−2), and a second source/drain that may be connected to the second source/drain of the transistor N2. The transistor P3b may have a gate the may receive the intermediate signal D_N(i−2). The drain/source voltage Vds across the input transistor P3 is generally constant and independent of the supply voltage AVDD.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a plurality of delay cells arranged as a voltage controlled oscillator configured to generate an oscillating signal having a frequency varied in response to a control signal, each of said delay cells comprises:
   a plurality of first transistors configured to generate a first output signal in response to said control signal and a plurality of first input signals; and
   a plurality of second transistors configured to generate a second output signal in response to said control signal and a plurality of second input signals,
   wherein (i) one of said first input signals to a first of said delay cells is said second output signal from said first delay cell, (ii) one of said second input signals to said first delay cell is said first output signal from said first delay cell, and (iii) one or more of said first output and said second output signals are presented as said oscillating signal.

2. The apparatus according to claim 1, wherein said apparatus further comprises a capacitance configured to couple a bias signal presented to said delay cells to a ground potential.

3. The apparatus according to claim 1, wherein said plurality of first transistors comprises:
   a first input transistor having (i) a gate configured to receive one of said first input signals and (ii) a drain coupled to a first output configured to present said first output signal;
   a second input transistor having (i) a gate configured to receive said second output signal and (ii) a drain coupled to said first output; and
   a first current control transistor having (i) a gate configured to receive said control signal and (ii) a drain coupled to said drain of said first input transistor.

4. The apparatus according to claim 3, wherein said plurality of first transistors further comprises a third input transistor having (i) a gate configured to receive another of said first input signals and (ii) a drain coupled to said first output.

5. The apparatus according to claim 1, wherein said delay cells are configured to propagate a plurality of cycles of said oscillating signal simultaneously.

6. The apparatus according to claim 5, wherein each of said plurality of cycles are synchronized to a substantially same frequency.

7. The apparatus according to claim 1, where in each of said delay cells a first combination of said first plurality of transistors and a second combination of said second plurality of transistors have substantially equal delays.

8. The apparatus according to claim 1, wherein said first output signal from said first delay cell is one of said first input signals to said third delay cell.

9. The apparatus according to claim 1, wherein said first plurality of transistors forms a logical NAND operation.

10. The apparatus according to claim 3, wherein said plurality of first transistors further comprises a second current control transistor arranged in series with said first current control transistor and having a gate to receive a bias signal.

11. An apparatus comprising:
   means for generating a plurality of first signals in response to a control signal, a plurality of third signals and feedback of said first signals;
   means for generating a plurality of second signals in response to said first signals and feedback of said second signals;
   means for generating said third signals in response to feedback of said third signals; and
   means for varying a frequency of said first signals in response to said control signal.

12. A method for generating an oscillating signal, comprising the steps of:
   (A) generating a plurality of output signals at each of a plurality of delay cells arranged as a voltage controlled oscillator in response to a control signal;
   (B) presenting said output signals from a first of said delays cells to a second of said delay cells;
   (C) feeding back said output signals from second delay cell to a plurality of inputs for said second delay cell;
   (D) presenting one or more of said output signals as said oscillating signal; and
   (E) varying a frequency of said oscillating signal in response to said control signal.

13. The method according to claim 12, further comprising the step of:
   presenting said output signals from said second delay cell to a third of said delay cells;
   feeding back said output signals from said third delay cell to a plurality of inputs for said third delay cell; and
   feeding forward said output signals from said first delay cell to said third delay cell.

14. The method according to claim 12, said method further comprising the step of:
   providing a bias signal to said delay cells.

15. The method according to claim 12, wherein a plurality of cycles of said oscillating signal propagate through said delay cells simultaneously.

16. The method according to claim 15, wherein each of said plurality of cycles are synchronized to said frequency.

17. The method according to claim 12, further comprising the step of:
   limiting a voltage swing of said output signals.

18. The method according to claim 12, wherein step (A) comprises the sub-step of:
   generating said output signals from said second delay cell in response to said output signals received from said first delay cell.

19. The method according to claim 18, wherein step (A) further comprises the sub-steps of:
   biasing a first of said output signals from said second delay cell toward a ground potential; and
   pulling said first of said output signals from said second delay cell toward a supply voltage in response to at least one of (i) a first of said output signals received from said first delay cell and (ii) a second of said output signals from said second delay cell being proximate to said ground potential.

* * * * *